(12) United States Patent
Kim et al.

(10) Patent No.: US 11,568,809 B2
(45) Date of Patent: *Jan. 31, 2023

(54) PIXEL CIRCUIT AND DISPLAY DEVICE INCLUDING THE SAME

(71) Applicant: SAMSUNG DISPLAY CO., LTD., Yongin-si (KR)

(72) Inventors: Dong Hwi Kim, Yongin-si (KR); Na Young Kim, Yongin-si (KR); Chul Ho Kim, Yongin-si (KR); Wang Jo Lee, Yongin-si (KR); Jin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 218 days.

This patent is subject to a terminal disclaimer.

(21) Appl. No.: 17/137,794

(22) Filed: Dec. 30, 2020

(65) Prior Publication Data

US 2021/0118365 A1 Apr. 22, 2021

Related U.S. Application Data

(63) Continuation of application No. 16/812,979, filed on Mar. 9, 2020, now Pat. No. 10,909,923.

(30) Foreign Application Priority Data

May 7, 2019 (KR) .................. 10-2019-0053251

(51) Int. Cl.
*G09G 3/3233* (2016.01)
*G09G 3/3275* (2016.01)
(Continued)

(52) U.S. Cl.
CPC ......... *G09G 3/3233* (2013.01); *G09G 3/3266* (2013.01); *G09G 3/3275* (2013.01);
(Continued)

(58) Field of Classification Search
CPC .. G09G 3/3233; G09G 3/3266; G09G 3/3275; G09G 2300/0426; H01L 27/3258;
(Continued)

(56) References Cited

U.S. PATENT DOCUMENTS 7,173,590 B2 2/2007 Uchino et al.
7,659,872 B2 2/2010 Yamashita et al.
(Continued)

FOREIGN PATENT DOCUMENTS

KR 10-0624137 9/2006
KR 10-0741973 7/2007
(Continued)

OTHER PUBLICATIONS

Notice of Allowance dated Oct. 1, 2020 In Corresponding U.S. Appl. No. 16/812,979.

*Primary Examiner* — Chanh D Nguyen
*Assistant Examiner* — Ngan T. Pham-Lu
(74) *Attorney, Agent, or Firm* — F. Chau & Associates, LLC

(57) ABSTRACT

A pixel circuit includes first to fifth transistors, a capacitor, and a light emitting element. The first transistor is coupled between first and second power lines, and includes a gate electrode coupled to a first node and a back-gate electrode coupled to a second node. The second transistor is coupled between a data line and the first node, and includes a gate electrode coupled to a first scan line. The third transistor is coupled between a third power line and the first node, and includes a gate electrode coupled to a reference scan line. The fourth transistor is coupled between a second node and a fourth power line, and includes a gate electrode coupled to a second scan line. The fifth transistor is coupled between a (Continued)

first power line and the one electrode of the first transistor, and includes a gate electrode coupled to a light-emitting control line.

20 Claims, 11 Drawing Sheets

(51) Int. Cl.
    *G09G 3/3266*     (2016.01)
    *H01L 27/32*     (2006.01)
    *H01L 27/12*     (2006.01)

(52) U.S. Cl.
    CPC ...... *H01L 27/3258* (2013.01); *H01L 27/3262* (2013.01); *H01L 27/3265* (2013.01); *H01L 27/3276* (2013.01); *G09G 2300/0426* (2013.01); *H01L 27/124* (2013.01); *H01L 27/1225* (2013.01); *H01L 27/1248* (2013.01); *H01L 27/1251* (2013.01); *H01L 27/1255* (2013.01)

(58) Field of Classification Search
    CPC ............. H01L 27/3262; H01L 27/3265; H01L 27/3276; H01L 27/1225; H01L 27/124; H01L 27/1248; H01L 27/1251; H01L 27/1255
    See application file for complete search history.

(56) References Cited

U.S. PATENT DOCUMENTS

| | | |
|---|---|---|
| 7,804,469 B2 | 9/2010 | Asano |
| 7,978,156 B2 | 7/2011 | Kim |
| 8,022,905 B2 | 9/2011 | Yamashita et al. |
| 8,654,111 B2 | 2/2014 | Uchino et al. |
| 8,659,584 B2 | 2/2014 | Yamashita et al. |
| 8,665,254 B2 | 3/2014 | Chung et al. |
| 8,780,016 B2 | 7/2014 | Yamashita et al. |
| 2008/0278464 A1 | 11/2008 | Yamamoto et al. |
| 2011/0069058 A1 | 3/2011 | Chung et al. |
| 2011/0122324 A1 | 5/2011 | Yamashita et al. |
| 2011/0122325 A1 | 5/2011 | Yamashita et al. |
| 2018/0006099 A1 | 1/2018 | Ka et al. |
| 2018/0096670 A1 | 4/2018 | Iwaki et al. |
| 2018/0268760 A1 | 9/2018 | Chen et al. |
| 2020/0357337 A1 | 11/2020 | Kim et al. |

FOREIGN PATENT DOCUMENTS

| | | |
|---|---|---|
| KR | 10-2008-0099800 | 11/2008 |
| KR | 10-2008-0103001 | 11/2008 |
| KR | 10-2009-0033008 | 4/2009 |
| KR | 10-1058110 | 8/2011 |
| KR | 10-1058111 | 8/2011 |
| KR | 10-1264386 | 5/2013 |
| KR | 10-1346339 | 12/2013 |
| KR | 10-1377624 | 3/2014 |
| KR | 10-1425892 | 7/2014 |
| KR | 10-2017-0081030 | 7/2017 |
| KR | 10-2018-0004369 | 1/2018 |

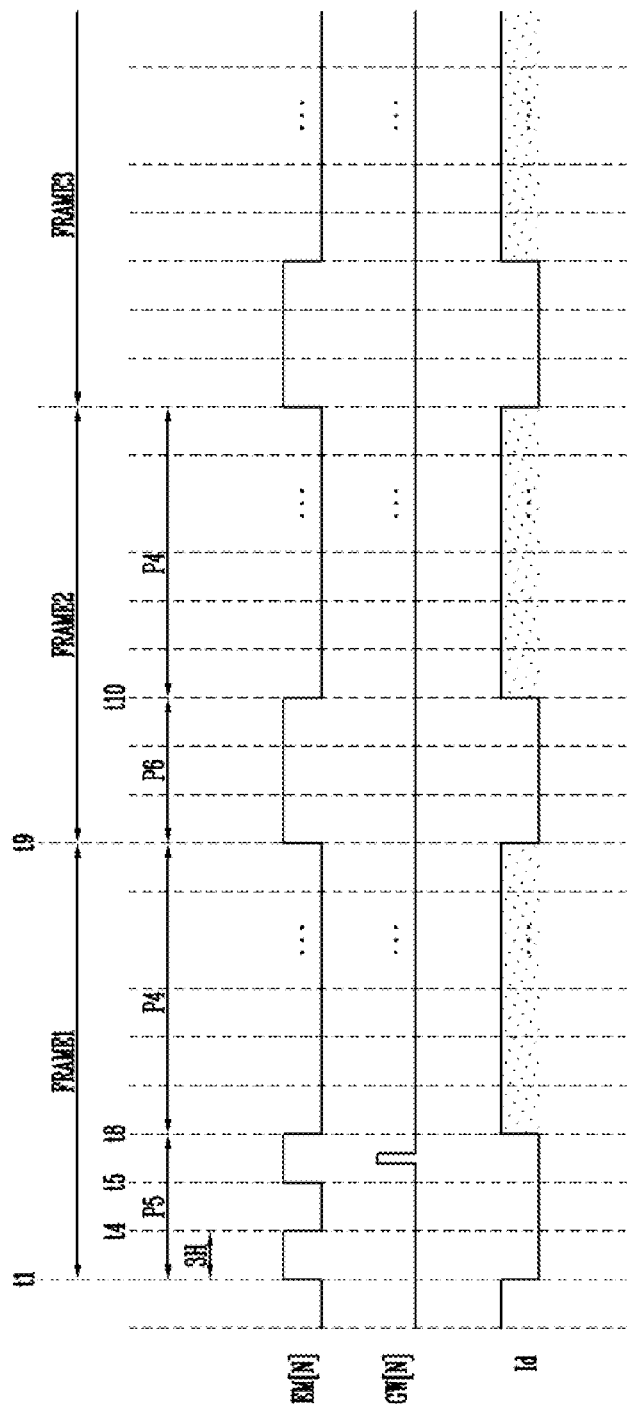

PIXEL CIRCUIT AND DISPLAY DEVICE INCLUDING THE SAME

CROSS-REFERENCE TO RELATED APPLICATION

The present application is a continuation application of U.S. patent application Ser. No. 16/812,979 filed Mar. 9, 2020, which claims priority under 35 U.S.C. § 119 to Korean Patent Application No. 10-2019-0053251, filed on May 7, 2019 in the Korean Intellectual Property Office, the disclosures of which are incorporated by reference herein in their entirety.

TECHNICAL FIELD

Exemplary embodiments of the inventive concept relate to a pixel circuit and a display device including the same.

DISCUSSION OF RELATED ART

Pixels include a light emitting element and a transistor (or transistors) configured to transmit a current corresponding to a data signal to the light emitting element.

A threshold voltage of the transistor has a variation, and may also vary depending on usage. Thus, a display device including the pixel may compensate for the threshold voltage of the transistor in the pixel through various compensation techniques (e.g., an internal compensation technique, an external compensation technique, etc.). For example, when the display device uses the internal compensation technique, the display device may compensate for the threshold voltage of the transistor while writing a data signal in the pixel.

As the resolution of the display device including the pixel increases or a driving frequency of the display device increases, a compensation time for compensating for the threshold voltage of the transistor in the pixel may become insufficient.

SUMMARY

According to an exemplary embodiment of the inventive concept, a pixel circuit may include a first power line, a second power line, a third power line, and a fourth power line, a data line configured to transmit a data signal, a first scan line and a second scan line configured to sequentially transmit a first gate signal, a reference scan line configured to transmit a second gate signal, a light-emitting control line configured to transmit a third gate signal, a first transistor including a first electrode, a second electrode coupled to a second node, a gate electrode coupled to a first node, and a back-gate electrode coupled to the second node, a second transistor including a first electrode coupled to the data line, a second electrode coupled to the first node, and a gate electrode coupled to the first scan line, a third transistor including a first electrode coupled to the third power line, a second electrode coupled to the first node, and a gate electrode coupled to the reference scan line, a fourth transistor including a first electrode coupled to the second node, a second electrode coupled to the fourth power line, and a gate electrode coupled to the second scan line, a fifth transistor including a first electrode coupled to the first power line, a second electrode coupled to the first electrode of the first transistor, and a gate electrode coupled to the light-emitting control line, a capacitor coupled between the second node and the first node, and a light emitting element coupled to the second node and the second power line.

The back-gate electrode of the first transistor may be disposed to overlap the gate electrode of the first transistor with an insulating layer interposed therebetween.

Each of the first to fourth transistors may include an oxide semiconductor, and the fifth transistor may include a silicon semiconductor.

The gate electrode of each of the first to fifth transistors may be disposed on a semiconductor.

The back-gate electrode of the first transistor and the gate electrode of the fifth transistor may be disposed on the same layer.

The second transistor may further include a back-gate electrode coupled to the gate electrode of the second transistor.

The third transistor may further include a back-gate electrode coupled to the gate electrode of the third transistor.

The fourth transistor may further include a back-gate electrode coupled to the gate electrode of the fourth transistor.

In a first section, the third transistor may be turned on in response to the second gate signal having a turn-on voltage level, and the fourth transistor may be turned on in response to the first gate signal having a turn-on voltage level.

In a second section, the fifth transistor may be turned on in response to the third gate signal having a turn-on voltage level and the fourth transistor may be turned off, and the second section may be different from the first section and longer than the first section.

In a third section, the second transistor may be turned on in response to the first gate signal having the turn-on voltage level, and the data signal may be written in the capacitor. The third section may be different from the first and second sections and may have the same width as that of the first section.

In a fourth section, the fifth transistor may be turned on in response to the third gate signal having the turn-on voltage level, and the light emitting element may emit light at a luminance corresponding to the data signal.

The first to fourth sections may be included in a first frame, the second to fourth transistors may maintain a turn-off state in a second frame subsequent to the first frame, and a first period when the fifth transistor is turned off in the second frame may be longer than a second period when the fifth transistor is turned off in the first frame.

A period when the light emitting element may emit light in the second frame may be substantially the same as a period when the light emitting element may emit light in the first frame.

According to an exemplary embodiment of the inventive concept, a display device may include a display including a first power line, a second power line, a third power line, a fourth power line, a data line, a first scan line, a second scan line, a third gate line, a light-emitting control line, and a pixel, a data driver configured to supply a data signal to the data line, and a gate driver configured to sequentially supply a first gate signal to the second scan line and the first scan line, to supply a second gate signal to the third gate line, and to supply a third gate signal to the light-emitting control line. The pixel may include a first transistor including a first electrode, a second electrode coupled to a second node, a gate electrode coupled to a first node, a back-gate electrode coupled to the second node, a second transistor including a first electrode coupled to the data line, a second electrode coupled to the first node, and a gate electrode coupled to the first scan line, a third transistor including a first electrode coupled to the third power line, a second electrode coupled to the first node, and a gate electrode coupled to the third gate line, a fourth transistor including a first electrode coupled to the second node, a second electrode coupled to the fourth power line, and a gate electrode coupled to the second scan line, a fifth transistor including a first electrode coupled to the first power line, a second electrode coupled to the first electrode of the first transistor, and a gate electrode coupled to the light-emitting control line, a capacitor coupled between the second node and the first node, and a light emitting element coupled to the second node and the second power line.

In a first section, the gate driver may supply the second gate signal having a turn-on voltage level to the third gate line, and may supply the first gate signal having a turn-on voltage level to the second scan line.

In a second section, the gate driver may supply the third gate signal having a turn-on voltage level to the light-emitting control line and may supply the first gate signal having a turn-off voltage level to the second scan line, and the second section may be different from the first section and may be longer than the first section.

In a third section, the gate driver may supply the first gate signal having the turn-on voltage level to the scan gate line, the third section may be different from the first and second sections and may have the same width as that of the first section.

In a fourth section, the gate driver may supply the third gate signal having the turn-on voltage level to the light-emitting control line, and the light emitting element may emit light at a luminance corresponding to the data signal.

The first to fourth sections may be included in a first frame, the second to fourth transistors may maintain a turn-off state in a second frame subsequent to the first frame, and a first period when the fifth transistor is turned off in the second frame may be longer than a second period when the fifth transistor is turned off in the first frame.

According to an exemplary embodiment of the inventive concept, a pixel may include a substrate, a buffer layer disposed on the substrate, first to fifth insulating layers sequentially disposed on the buffer layer, a first semiconductor pattern disposed on the buffer layer, a first gate electrode disposed on the first insulating layer, a back-gate electrode disposed on the first insulating layer, a second semiconductor pattern disposed on the second insulating layer, a second gate electrode disposed on the third insulating layer, a power line disposed on the fifth insulating layer and contacting the first semiconductor pattern through a contact hole passing through the first through fourth insulating layers, a first bridge pattern disposed on the fifth insulating layer, contacting the first semiconductor pattern through a contact hole passing through the first through fourth insulating layers, and contacting the second semiconductor pattern through a contact hole passing through the third and fourth insulating layers, and a second bridge pattern disposed on the fifth insulating layer, contacting the second semiconductor pattern through a contact hole passing through the third and fourth insulating layers, and contacting the back-gate electrode through a contact hole passing through the second to fourth insulating layers.

BRIEF DESCRIPTION OF THE DRAWINGS

The above and other features of the inventive concept will be more fully understood by describing in detail exemplary embodiments thereof with reference to the accompanying drawings.

FIG. 6 is a waveform diagram illustrating signals measured in the pixel of FIG. 2 according to an exemplary embodiment of the inventive concept.

DETAILED DESCRIPTION OF THE EMBODIMENTS

Figure 1:
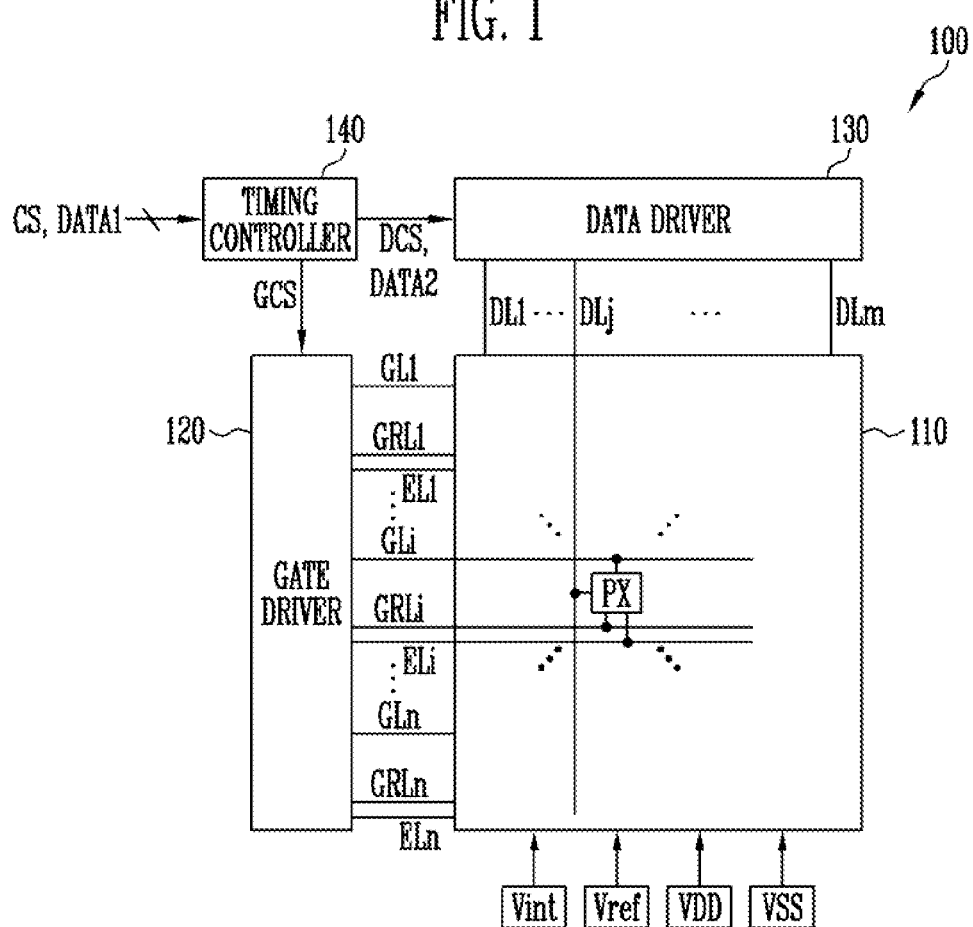
FIG. 1 is a block diagram illustrating a display device according to an exemplary embodiment of the inventive concept.

Exemplary embodiments of the inventive concept are related to a pixel circuit and a display device, capable of more sufficiently securing a compensation time for compensating for a threshold voltage of a transistor.

Exemplary embodiments of the inventive concept will be described more fully hereinafter with reference to the accompanying drawings. Like reference numerals may refer to like elements throughout this application.

FIG. 1 is a block diagram illustrating a display device according to an exemplary embodiment of the inventive concept.

Referring to FIG. 1, a display device 100 may include a display 110, a gate driver 120, a data driver (or source driver) 130, and a timing controller 140.

The display 110 may include gate lines GL1 to GLn, GRL1 to GRLn and EL1 to ELn (where n is a positive integer), data lines DL1 to DLm (where m is a positive integer), and a pixel PX. The display 110 may further include power lines (e.g., first to fourth power lines). The gate lines GL1 to GLn, GRL1 to GRLn, and EL1 to ELn may include scan lines GL1 to GLn, reference scan lines GRL1 to GRLn, and light-emitting control lines EL1 to ELn. The pixel PX may be disposed in an area (e.g., a pixel area) delimited by the gate lines GL1 to GLn, GRL1 to GRLn and EL1 to ELn and the data lines DL1 to DLm.

The pixel PX may be coupled to at least one of the scan lines GL1 to GLn, one of the reference scan lines GRL1 to GRLn, one of the light-emitting control lines EL1 to ELn, and one of the data lines DL1 to DLn. For example, the pixel PX may be coupled to an ith scan line GL1, an ith reference scan line GRL1, an ith light-emitting control line EL1, and a jth data line DLj (where i and j are positive integers).

The pixel PX may write a data signal provided through the jth data line DLj in response to a first gate signal provided through the ith scan line GL1, compensate for the data signal in response to a second gate signal provided through the ith reference scan line GRL1 (for example, compensate for an error caused by a threshold voltage of a transistor in the pixel PX), and emit light at luminance corresponding to the data signal that is compensated for in response to a third gate signal provided through the ith light-emitting control line EL1.

A configuration of the pixel PX will be described below with reference to FIG. 2.

The gate driver 120 may generate the first gate signal (or first scan signal), the second gate signal (or second scan signal), or the third gate signal (or light-emitting control signal) based on a gate control signal GCS, sequentially provide the first gate signal to the scan lines GL1 to GLn, sequentially provide the second gate signal to the reference scan GRL1 to GRLn, and sequentially or simultaneously provide the third gate signal to the light-emitting control lines EL1 to ELn. Here, the gate control signal GCS may include a start signal, clock signals, or the like, and may be provided from the timing controller 140. For example, the gate driver 120 may include a shift register that sequentially generates or outputs a pulse type of the first gate signal, the second gate signal, or the third gate signal corresponding to a pulse type of the start signal using the clock signals.

Although it has been described that the gate driver 120 generates all of the first to third gate signals, the gate driver 120 is not limited thereto. For example, the gate driver 120 may include a first gate drive circuit (or first scan driver) that generates the first gate signal, a second gate drive circuit (or second scan driver) that generates the second gate signal, and a third gate drive circuit (or light-emitting driver) that generates the third gate signal.

According to exemplary embodiments of the inventive concept, the gate driver 120 may generate the second gate signal independently of the first gate signal, and a pulse width of the second gate signal may be set or adjusted to be different from a pulse width of the first gate signal. For example, the width of the second gate signal having a turn-on voltage level for turning on the transistor in the pixel PX may be larger than the width of the first gate signal having a turn-on voltage level. Thus, when the second gate signal is used to compensate for the threshold voltage of the transistor in the pixel PX, the compensation time for compensating for the threshold voltage of the transistor can be adjusted and more sufficiently secured.

The first and second gate signals will be described below with reference to FIG. 4.

The data driver 130 may generate data signals based on image data DATA2 and a data control signal DCS provided from the timing controller 140, and may provide the data signals to the display 110 (or the pixel PX). Here, the data control signal DCS is a signal for controlling the operation of the data driver 130, and may include a load signal (or data enable signal) for instructing the output of a valid data signal.

The timing controller 140 may receive input image data DATA1 and a control signal CS from an external device (e.g., a graphic processor), generate the gate control signal GCS and the data control signal DCS based on the control signal CS, and convert the input image data DATA1 to generate the image data DATA2. For example, the timing controller 140 may convert the input image data DATA1 in a RGB format into the image data DATA2 in a PenTile (e.g., RGBG) format conforming to a pixel array in the display 110.

The display 110 may be supplied with power supply voltages VDD, VSS, Vref, and Vint. The power supply voltages VDD, VSS, Vref, and Vint are voltages required to operate the pixel PX. For example, a first power supply voltage VDD may have a voltage level that is higher than that of a second power supply voltage VSS. The power supply voltages VDD, VSS, Vref, and Vint will be described below with reference to FIG. 2.

At least one of the gate driver 120, the data driver 130, and the timing controller 140 may be provided on the display 110, or may be implemented as an integrated circuit (IC) to be coupled to the display 110 in the form of a tape carrier package. Alternatively, at least two of the gate driver 120, the data driver 130, and the timing controller 140 may be implemented as a single IC.

Figure 2:
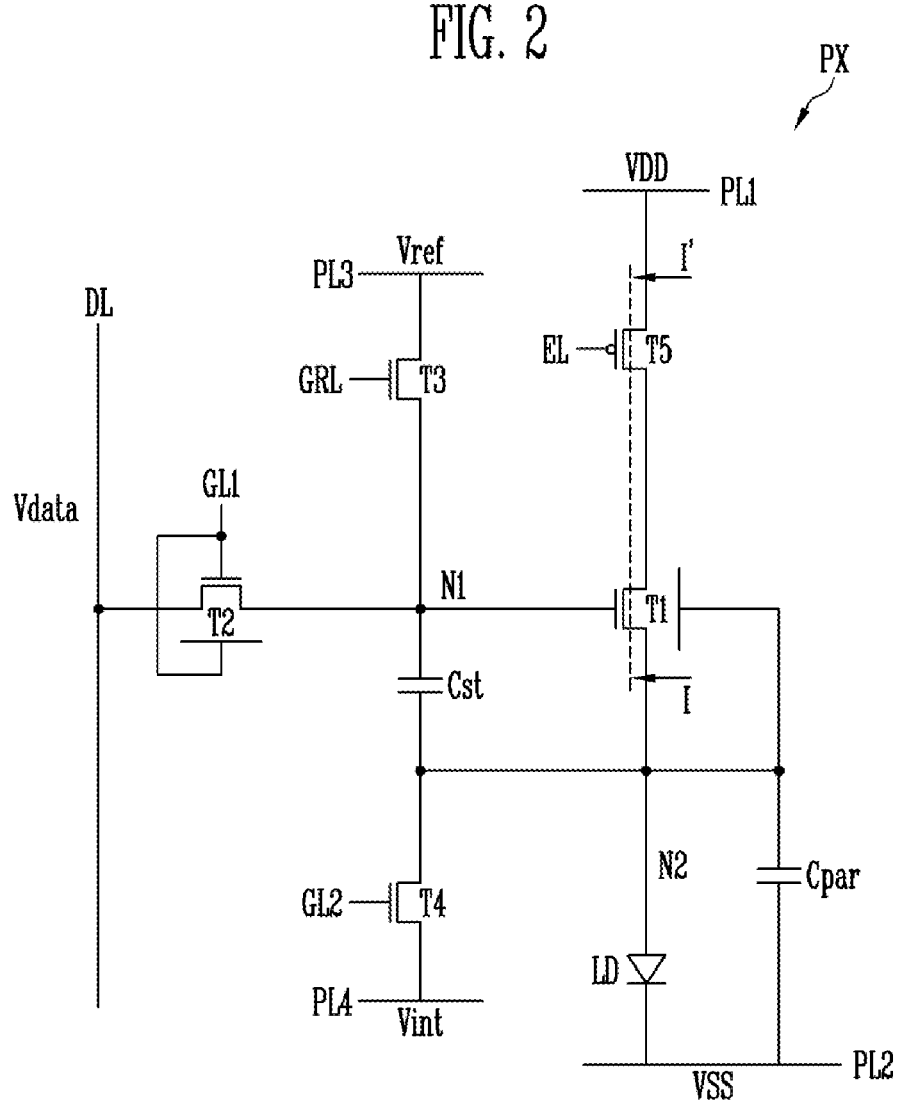
FIG. 2 is a circuit diagram illustrating a pixel included in the display device of FIG. 1 according to an exemplary embodiment of the inventive concept.

FIG. 2 is a circuit diagram illustrating a pixel included in the display device of FIG. 1 according to an exemplary embodiment of the inventive concept.

Referring to FIG. 2, the pixel PX may be coupled to a first power line PL1, a second power line PL2, a third power line PL3, a fourth power line PL4, a first scan line GL1, a second scan line GL2, a reference scan line GRL, a light-emitting control line EL, and a data line DL. The first power line PL1 may transmit the first power supply voltage VDD, the second power line PL2 may transmit the second power supply voltage VSS, the third power line PL3 may transmit a third power supply voltage Vref (or reference voltage), and the fourth power line PL4 may transmit a fourth power supply voltage Vint (or initialization voltage). The first scan line GL1 and the second scan line GL2 (or previous scan line) may be included in the scan lines GL1 to GLn described with reference to FIG. 1. The first gate signal may be supplied to the second scan line GL2 prior to the first scan line GL1. The reference scan line GRL (or reference scan line) may be included in the reference scan lines GRL1 to GRLn described with reference to FIG. 1, and the light-emitting control line EL may be included in the light-emitting control lines EL1 to ELn described with reference to FIG. 1. The data line DL may be included in the data lines DL1 to DLm described with reference to FIG. 1.

The pixel PX (or pixel circuit) may include a first transistor T1, a second transistor T2, a third transistor T3, a fourth transistor T4, a fifth transistor T5, a capacitor Cst, and a light emitting element LD. The light emitting element LD may have a parasitic capacitor Cpar (or parasitic capacitance).

Each of the first transistor T1, the second transistor T2, the third transistor T3, and the fourth transistor T4 may be an N-type transistor, while the fifth transistor T5 may be a P-type transistor. For example, each of the first transistor T1, the second transistor T2, the third transistor T3, and the fourth transistor T4 may include an oxide semiconductor, and the fifth transistor T5 may include a silicon semiconductor (e.g., low temperature polysilicon (LTPS)).

The first transistor T1 (or drive transistor) may include a first electrode, a second electrode coupled to a second node N2, a gate electrode coupled to a first node N1, and a back-gate electrode coupled to the second node N2. Here, the back-gate electrode may be disposed to overlap the gate electrode with an insulating layer interposed therebetween, may form a body of the transistor, and may function as the gate electrode. In other words, the first transistor T1 may be implemented as a back-gate transistor that further includes the back-gate electrode. The back-gate transistor will be described below with reference to FIG. 3.

As the back-gate electrode of the first transistor T1 is coupled to the second node N2, a voltage change of the second electrode (e.g., source electrode) of the first transistor T1 may also be transmitted to a voltage change of the gate electrode while the pixel PX emits light. Thus, a voltage (e.g., gate-source voltage) between the second electrode and the gate electrode of the first transistor T1 set through the compensating operation, which will be described below, may be maintained, and the pixel PX may emit light at a desired luminance.

The second transistor T2 (or switching transistor) may include a first electrode coupled to the data line DL, a second electrode coupled to the first node N1, a gate electrode coupled to the first scan line GL1, and a back-gate electrode coupled to the first scan line GL1 (or gate electrode). In other words, the second transistor T2 may be implemented as a back-gate transistor.

As the back-gate electrode of the second transistor T2 is coupled to the first scan line GL1, the second transistor T2 may have the structure of a double-gate transistor, and may more precisely perform an on-off operation. Therefore, even if the turn-on period of the second transistor T2 becomes short, a data signal Vdata can be more precisely transmitted to the first node N1.

The third transistor T3 (or compensation transistor) may include a first electrode coupled to the third power line PL3, a second electrode coupled to the first node N1, and a gate electrode coupled to the reference scan line GRL.

The fourth transistor T4 (or initialization transistor) may include a first electrode coupled to the second node N2, a second electrode coupled to the fourth power line PL4, and a gate electrode coupled to the second scan line GL2.

The fifth transistor T5 (or light emitting transistor) may include the first electrode coupled to the first power line PL1, a second electrode coupled to the first electrode of the first transistor T1, and a gate electrode coupled to the light-emitting control line EL.

The capacitor Cst (or storage capacitor) may be coupled between the first node N1 and the second node N2.

The light emitting element LD may be coupled between the second node N2 and the second power line PL2, and may emit light at a luminance corresponding to a current (or drive current) supplied via the first transistor T1. The light emitting element LD may be implemented as an organic light emitting diode, but is not limited thereto. In other words, the light emitting element LD may be implemented as an inorganic light emitting diode or a plurality of inorganic light emitting diodes.

The operation of the pixel PX will be described with reference to FIG. 4.

Figure 3:
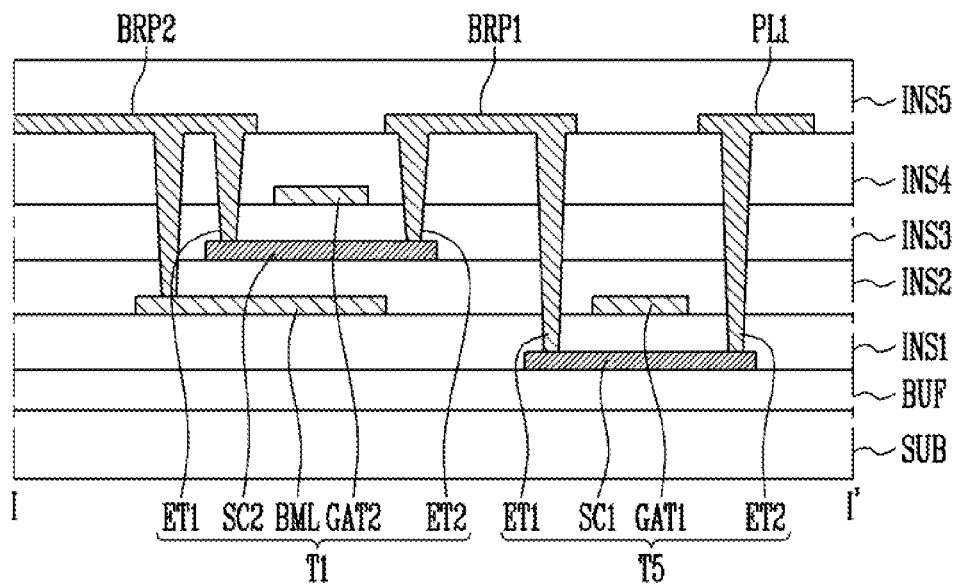
FIG. 3 is a sectional view illustrating the pixel taken along line I-I' of FIG. 2 according to an exemplary embodiment of the inventive concept.

FIG. 3 is a sectional view illustrating the pixel taken along line I-I' of FIG. 2 according to an exemplary embodiment of the inventive concept. FIG. 3 shows the first transistor T1 and the fifth transistor T5 included in the pixel PX of FIG. 2.

Referring to FIG. 3, the pixel PX may include a substrate SUB, a buffer layer BUF, insulating layers INS1, INS2, INS3, INS4, and INS5, semiconductor patterns SC1 and SC2, and conductive patterns GAT1, GAT2, BML, BRP1, BRP2, and PL1.

The substrate SUB may form a base member of the pixel PX (or display device 100). The substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

The buffer layer BUF may be disposed on the substrate SUB, and the buffer layer BUF may prevent impurities from diffusing into a circuit device. The buffer layer BUF may be formed of a single layer, or may be formed of multiple layers having at least two or more layers. If the buffer layer BUF has a multi-layer structure, the layers may be formed of the same material or different materials. In an exemplary embodiment of the inventive concept, the buffer layer BUF may be omitted.

The insulating layers INS1, INS2, INS3, INS4, and INS5 may be sequentially disposed on the substrate SUB (or buffer layer BUF), and may include a first insulating layer INS1 (or first gate insulating layer), a second insulating layer INS2 (or first interlayer insulating layer), a third insulating layer INS3 (or second gate insulating layer), a fourth insulating layer INS4 (or second interlayer insulating layer), and a fifth insulating layer INS5 (or passivation layer).

Each of the insulating layers INS1, INS2, INS3, INS4, and INS5 may be formed of a single layer or multiple layers, and may contain at least one inorganic insulating material and/or organic insulating material. For example, each of the insulating layers INS1, INS2, INS3, INS4, and INS5 may include various kinds of organic/inorganic insulating materials that are currently known to those skilled in the art, such as silicon nitride (SiNx), and is not limited to a specific material. Furthermore, the insulating layers INS1, INS2, INS3, INS4, and INS5 may include different insulating materials, or at least some of the insulating layers INS1, INS2, INS3, INS4, and INS5 may include the same insulating material.

The semiconductor patterns SC1 and SC2 may include a first semiconductor pattern SC1 and a second semiconductor pattern SC2, and the conductive patterns GAT1, GAT2, BML, BRP1, BRP2, and PL1 may include a first gate electrode GAT1 (or first gate electrode pattern), a back-gate electrode BML (or back-gate electrode pattern), a second gate electrode GAT2 (or second gate electrode pattern), a first bridge pattern BRP1, a second bridge pattern BRP2, and a first power line PL1 (or first conductive pattern).

Each of the first gate electrode GAT1, the back-gate electrode BML, the second gate electrode GAT2, the first bridge pattern BRP1, the second bridge pattern BRP2, and the first power line PL1 may include at least one conductive material, such as Ag, Mg, Al, Pt, Pd, Au, Ni, Nd, Ir, Cr, Ti, or alloys thereof, but is not limited thereto.

The first semiconductor pattern SC1 may be disposed on the buffer layer BUF. For example, the first semiconductor pattern SC1 may be interposed between the buffer layer BUF and the first insulating layer INS1. The first semiconductor pattern SC1 may include a first area which comes into contact with a first transistor electrode ET1 of the fifth transistor T5, a second area which comes into contact with a second transistor electrode ET2 of the fifth transistor T5, and a channel area disposed between the first and second areas. One of the first and second areas may be a source area, and the other may be a drain area.

The first semiconductor pattern SC1 may be a semiconductor pattern formed of polysilicon, amorphous silicon, LTPS, etc. The channel area of the first semiconductor pattern SC1 may be an intrinsic semiconductor as a semiconductor pattern which is not doped with impurities. Each of the first and second areas of the first semiconductor pattern SC1 may be a semiconductor pattern doped with a predetermined impurity.

The first gate electrode GAT1 may be disposed on the first insulating layer INS1. For example, the first gate electrode GAT1 may be disposed between the first insulating layer INS1 and the second insulating layer INS2. The first gate electrode GAT1 may overlap at least one area of the first semiconductor pattern SC1.

The first gate electrode GAT1, the first semiconductor pattern SC1, and the first and second transistor electrodes ET1 and ET2 (e.g., first and second transistor electrodes ET1 and ET2 coming into contact with the first semiconductor pattern SC1) may constitute the fifth transistor T5.

The back-gate electrode BML may be disposed on the first insulating layer INS1. In other words, the back-gate electrode BML may be disposed on the same layer as the first gate electrode GAT1.

The second semiconductor pattern SC2 may be disposed on the second insulating layer INS2. For example, the second semiconductor pattern SC2 may be disposed between the second and third insulating layers INS2 and INS3. The second semiconductor pattern SC2 may include a first area which comes into contact with the first transistor electrode ET1 of the first transistor T1, a second area which comes into contact with the second transistor electrode ET2 of the first transistor T1, and a channel area disposed between the first and second areas. One of the first and second areas may be a source area, and the other may be a drain area.

The second semiconductor pattern SC2 may be a semiconductor pattern made of an oxide semiconductor or the like. The channel area of the second semiconductor pattern SC2 may be an intrinsic semiconductor as a semiconductor pattern which is not doped with impurities. Each of the first and second areas of the second semiconductor pattern SC2 may be a semiconductor pattern doped with a predetermined impurity.

The second semiconductor SC2 may be disposed to overlap the back-gate electrode BML, and the back-gate electrode BML may overlap at least one area of the second semiconductor pattern SC2.

The second gate electrode GAT2 may be disposed on the third insulating layer INS3. For example, the second gate electrode GAT2 may be disposed between the third insulating layer INS3 and the fourth insulating layer INS4. The second gate electrode GAT2 may overlap at least one area of the second semiconductor pattern SC2.

The second gate electrode GAT2, the second semiconductor pattern SC2, and the first and second transistor electrodes ET1 and ET2 (e.g., first and second transistor electrodes ET1 and ET2 coming into contact with the second semiconductor pattern SC2) may constitute the first transistor T1.

The first bridge pattern BRP1, the second bridge pattern BRP2, and the first power line PL1 may be disposed on the fourth insulating layer INS4.

The first bridge pattern BRP1 may come into contact with one area of the second semiconductor pattern SC2 through contact holes passing through the third and fourth insulating layers INS3 and INS4, and may constitute the second transistor electrode ET2 of the first transistor T1. Furthermore, the first bridge pattern BRP1 may come into contact with one area of the first semiconductor pattern SC1 through contact holes passing through the first to fourth insulating layers INS1 to INS4, and may constitute the first transistor electrode ET1 of the fifth transistor T5. As described with reference to FIG. 2, the first bridge pattern BRP1 may couple the first electrode of the first transistor T1 with the second electrode of the fifth transistor T5.

The second bridge pattern BRP2 may come into contact with one area of the second semiconductor pattern SC2 through the contact holes passing through the third and fourth insulating layers INS3 and INS4, and may constitute the first transistor electrode ET1 of the first transistor T1. Furthermore, the second bridge pattern BRP2 may come into contact with the back-gate electrode BML through the contact holes passing through the second to fourth insulating layers INS2 to INS4. The back-gate electrode BML may be coupled to the first transistor electrode ET1 of the first transistor T1 through the second bridge pattern BRP2.

The second bridge pattern BRP2 may be coupled with the light emitting element LD (see FIG. 2) formed on the fifth insulating layer INS5, and may constitute the second node N2 described with reference to FIG. 2.

The first power line PL1 may come into contact with one area of the first semiconductor pattern SC1 through the contact holes passing through the first to fourth insulating layers INS1 to INS4, and may constitute the second transistor electrode ET2 of the fifth transistor T5.

Although FIG. 3 shows that the third insulating layer INS3 is disposed entirely on the second insulating layer INS2, the inventive concept is not limited thereto. For example, the third insulating layer INS3 may be disposed only on one area (e.g., the channel area) of the second semiconductor pattern SC2.

Furthermore, although FIG. 3 shows that each of the first transistor T1 and the fifth transistor T5 has a top-gate structure (e.g., a structure in which the gate electrode is disposed on a semiconductor layer), the inventive concept is not limited thereto. For example, at least one of the first transistor T1 and the fifth transistor T5 may have a bottom-gate structure.

Figure 4:
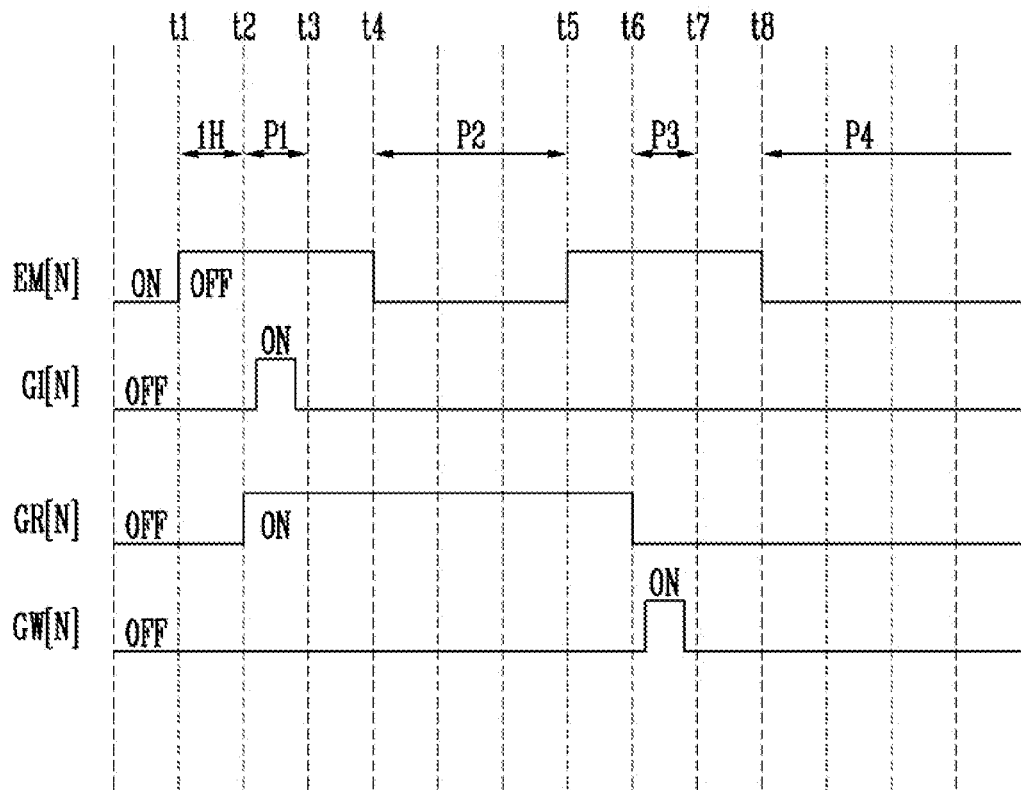
FIG. 4 is a waveform diagram illustrating signals measured in the pixel of FIG. 2 according to an exemplary embodiment of the inventive concept.

FIG. 4 is a waveform diagram illustrating signals measured in the pixel of FIG. 2 according to an exemplary embodiment of the inventive concept. FIG. 4 illustrates a first gate signal GW[N] measured in the first scan line GL1 of FIG. 2, a previous gate signal GI[N] measured in the second scan line GL2, a second gate signal GR[N] measured in the reference scan line GRL, and a third gate signal EM[N] measured in the light-emitting control line EL. FIGS. 5A to 5D are circuit diagrams illustrating an operation of the pixel according to the waveform diagram of FIG. 4 according to an exemplary embodiment of the inventive concept. FIGS. 5A to 5D schematically illustrate the operation of the pixel according to the waveform diagram of FIG. 4.

First, referring to FIGS. 2 to 4, at a first time t1 (or at a first time point), the third gate signal EM[N] may be transferred from a turn-on voltage level to a turn-off voltage level. Here, the turn-on voltage level may be a voltage level at which the transistors T1 to T5 in the pixel PX are turned on, while the turn-off voltage level may be a voltage level at which the transistors T1 to T5 in the pixel PX are turned off. For example, as the fifth transistor T5 is implemented as a P-type transistor, the turn-on voltage level of the third gate signal EM[N] may have a logic low level (or low voltage level), and the turn-off voltage level of the third gate signal EM[N] may have a logic high level (or high voltage level). For example, as each of the first to fourth transistors T1 to T4 is implemented as N-type transistors, the turn-on voltage level of the first gate signal GW[N], previous gate signal GI[N], and second gate signal GR[N] may have a logic high level (or high voltage level), and the turn-off voltage level of the first gate signal GW[N], previous gate signal GI[N], and second gate signal GR[N] may have a logic low level (or low voltage level).

The fifth transistor T5 may be turned off in response to the third gate signal EM[N] having the turn-off voltage level.

Each of the previous gate signal GI[N], the second gate signal GR[N], and the first gate signal GW[N] may have a turn-off voltage level. In response to the previous gate signal GI[N], the second gate signal GR[N], and the first gate signal GW[N] having the turn-off voltage level, each of the second transistor T2, the third transistor T3, and the fourth transistor T4 may maintain a turn-off state. Thus, the pixel PX may not emit light or enter a non-emitting section.

Figure 5A:
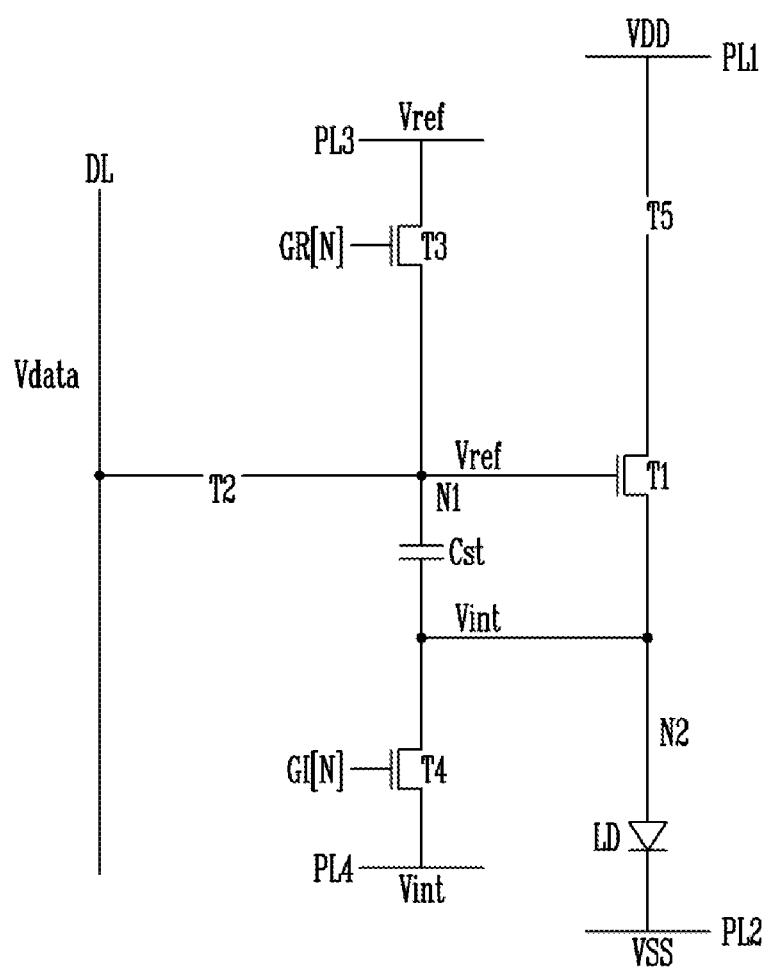
FIGS. 5A to 5D are circuit diagrams illustrating an operation of the pixel according to the waveform diagram of FIG. 4 according to an exemplary embodiment of the inventive concept.

Subsequently, at a second time t2, the second gate signal GR[N] may be transferred to the turn-on voltage level. The second time t2 may be a time that has elapsed by one horizontal time (1H) from the first time t. In this case, as illustrated in FIG. 5A, in response to the second gate signal GR[N] of the turn-on voltage level, the third transistor T3 may be turned on, and the first node N1 (or the gate electrode of the first transistor T1) may be initialized by the third power supply voltage Vref.

Immediately after the second time t2, the previous gate signal GI[N] may be transferred to the turn-on voltage level. In this case, as illustrated in FIG. 5A, in response to the previous gate signal GI[N] having the turn-on voltage level, the fourth transistor T4 may be turned on, and the second node N2 (e.g., the second electrode of the first transistor T1 or the capacitor Cst) may be initialized by the fourth power supply voltage Vint. A voltage difference between the third power supply voltage Vref and the fourth power supply voltage Vint may be larger than the threshold voltage of the first transistor T.

Subsequently, at a third time t3 or immediately before the third time t3, the previous gate signal GI[N] may be transferred to the turn-off voltage level. In other words, the previous gate signal GI[N] may have the turn-on voltage level for about one horizontal time (H). A first section P1 (e.g., a section in which the previous gate signal GI[N] has the turn-on voltage level or a first period) between the second time t2 and the third time t3 may be referred to as an initialization section.

Figure 5B:
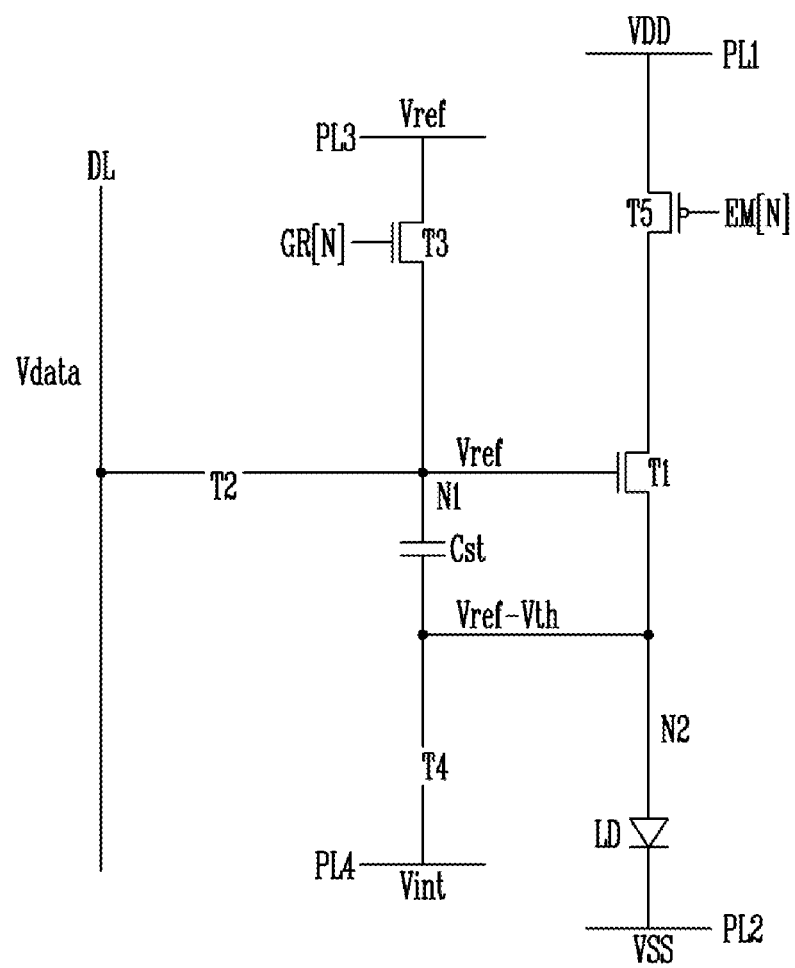

At a fourth time t4, the third gate signal EM[N] may be transferred to the turn-on voltage level. In this case, as illustrated in FIG. 5B, in response to the third gate signal EM[N] of the turn-on voltage level, the fifth transistor T5 may be turned on, and the first electrode (e.g., drain electrode) of the first transistor T1 may be coupled to the first power line PL1. Since the third power supply voltage Vref is applied to the first node N1, a current may flow towards the first power line PL1 in the first transistor T1. Thus, the voltage level of the second electrode (the source electrode or the second node N2) of the first transistor T1 may be lowered, and a voltage corresponding to the threshold voltage Vth of the first transistor T1 may be stored in the capacitor Cst. The second electrode (the source electrode or the second node N2) of the first transistor T1 may have substantially the same level as a voltage difference Vref-Vth between the third power supply voltage Vref and the threshold voltage Vth.

At a fifth time t5, the third gate signal EM[N] may be transferred to the turn-off voltage level. The fifth time t5 may be a time after a third horizontal time to the fourth time t4. In this case, the pixel PX may compensate for the threshold voltage Vth of the first transistor T1 during the third horizontal time. A second section P2 between the fourth time t4 and the fifth time t5 may be referred to as a compensation section.

Figure 5C:
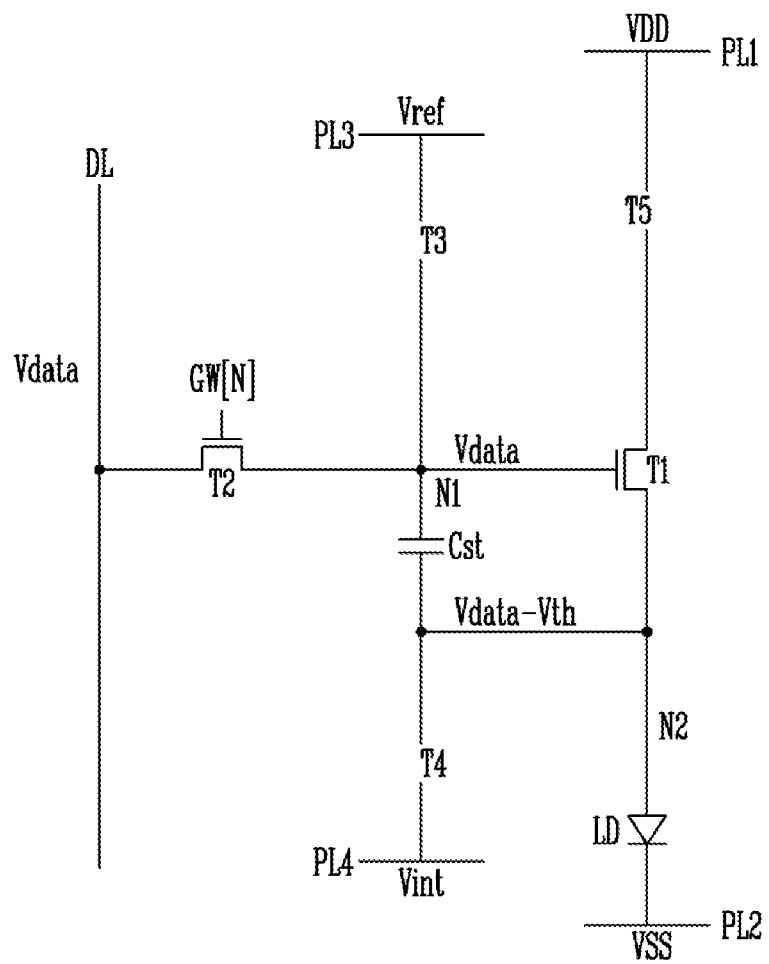

At a sixth time t6, the second gate signal GR[N] may be transferred to the turn-off voltage. Immediately after the sixth time t6, the first gate signal GW[N] may be transferred to the turn-on voltage level. In this case, as illustrated in FIG. 5C, in response to the first gate signal GW[N] having the turn-on voltage level, the second transistor T2 may be turned on, and the data signal Vdata (or data voltage) may be transmitted from the data line DL to the first node N1 (or the gate electrode of the first transistor T1). By the coupling operation of the capacitor Cst, the voltage of the second node N2 may have a voltage level corresponding to a voltage difference Vdata-Vth between the data signal Vdata and the threshold voltage Vth.

At a seventh time t7 or immediately before the seventh time t7, the first gate signal GW[N] may be transferred to the turn-off voltage level. In other words, a third section P3 (or a section in which the first gate signal GW[N] has the turn-on voltage level) between the sixth time t6 and the seventh time t7 may be referred to as a data write section.

Figure 5D:
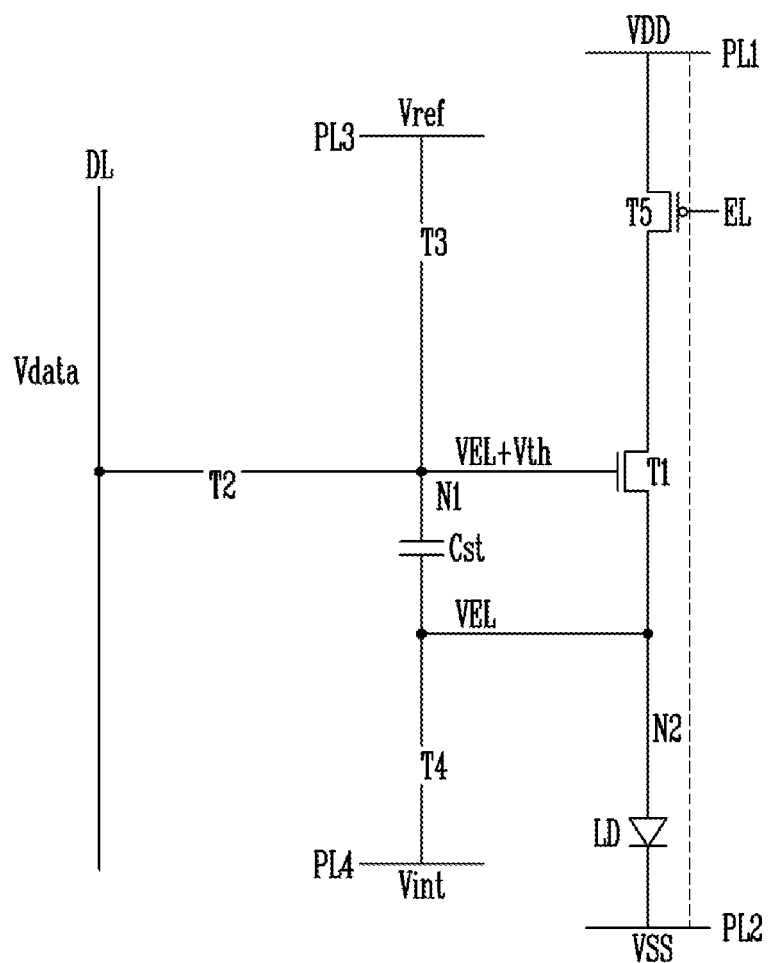

Subsequently, at an eighth time t8, the third gate signal EM[N] may be transferred to the turn-on voltage level. In this case, as illustrated in FIG. 5D, the fifth transistor T5 may be turned on in response to the third gate signal EM[N] of the turn-on voltage level. The voltage level of the second electrode (e.g., second node N2) of the first transistor T1 may rise to a specific voltage level VEL depending on the first power supply voltage VDD applied to the first electrode of the first transistor T1 through the fifth transistor T5. In addition, a voltage level of the gate electrode of the first transistor T1 (e.g., the first node N1) may rise to a sum VEL+Vth of the specific voltage level VEL and the threshold voltage Vth by the capacitor Cst.

As the voltage level of the second electrode of the first transistor T1 (e.g., the second node N2) rises, a voltage difference between an anode electrode and a cathode electrode of the light emitting element LD may be increased and the light emitting element LD may emit light. In other words, the pixel PX may enter a light emitting section and may emit light until the third gate signal EM[N] is transferred to the turn-on voltage level, for example, in a fourth section P4.

A current path may be created between the first power line PL1 and the second power line PL2 through the first transistor T1 and the fifth transistor T5. Depending on the current flowing through the first transistor T1, the potential of the second electrode (e.g., second node N2) of the first transistor T1 may rise to the specific voltage level VEL. The potential of the gate electrode of the first transistor T1 may also be increased by the capacitor Cst.

As described with reference to FIGS. 4 to 5D, the pixel PX may compensate for the threshold voltage Vth of the first transistor T1 in the second section P2, and may write the data signal Vdata in the third section P3 different from the second section P2 (or independent from the second section P2). Furthermore, the size of the second section P2 (e.g., the compensation section) may be adjusted by varying the pulse width of the second gate signal GR[N]. Therefore, the pixel PX may have a more sufficient compensation time.

FIG. 6 is a waveform diagram illustrating signals measured in the pixel of FIG. 2 according to an exemplary embodiment of the inventive concept.

The display device 100 may be operated in a normal mode or in a low power mode. For example, the display device 100 may display a plurality of frame images (e.g., 60 frame images) for one second while being driven at a reference frequency (e.g., 60 Hz) in the normal mode. Furthermore, the display device 100 may display several frame images (e.g., one frame image) for one second while being driven at a low frequency (e.g., 1 Hz) in the low power mode. FIG. 6 illustrates signals measured in the pixel for one second, when the display device 100 is driven in the low power mode.

In FIG. 6, the first gate signal GW[N] measured in the first scan line GL1 of FIG. 2, the third gate signal EM[N]

measured in the light-emitting control line EL, and a current Id flowing in the first transistor T1 (or light emitting element LD) are illustrated.

Referring to FIG. 6, the first gate signal GW[N] and the third gate signal EM[N] in a first frame section FRAME1 may be substantially equal to the first gate signal GW[N] and the third gate signal EM[N], respectively, described with reference to FIG. 4. Thus, a duplicated description will not be repeated herein.

According to the third gate signal EM[N], during the fourth section P4 between the eighth time t8 and a ninth time t9, the current Id corresponding to the data signal (e.g., data signal previously supplied in response to the gate signal GW[N]) is supplied to the light emitting element LD. The light emitting element LD may emit light at a luminance corresponding to the current Id.

In other words, in the first frame section FRAME1, the pixel PX may receive the data signal from the external device (e.g., the data driver 130 described with reference to FIG. 1), and may emit light at a luminance corresponding to the data signal in the fourth section P4.

At the ninth time t9, the operation of the pixel PX may be substantially equal to that of the pixel PX at the first time t.

At the ninth time t9, the third gate signal EM[N] may be transferred to the turn-off voltage level. At a tenth time t10, the third gate signal EM[N] may be transferred to the turn-on voltage level. Here, an interval (or a size of a sixth section P6) between the ninth time t9 and the tenth time t10 may be equal to an interval (or a size of a fifth section P5) between the first time t1 and the eighth time t8. For example, the tenth time t1 may be a time that has elapsed from the ninth time t9. Thus, in the sixth section P6, the pixel PX may not emit light in response to the third gate signal EM[N] of the turn-off voltage level.

In the sixth section P6, the first gate signal GW[N] may be maintained at the turn-off voltage level, so that the data signal may not be further supplied to the pixel PX. As the first gate signal GW[N] is maintained at the turn-off voltage level, a previous gate signal (e.g., the previous gate signal GI[N] described with reference to FIG. 4) such as the first gate signal GW[N] at a previous time may be maintained at the turn-off voltage level. The second gate signal GR[N] may be maintained at the turn-off voltage level. In other words, the second to fourth transistors T2 to T4 may maintain a turn-off state. Therefore, in the sixth section P6, the initialization operation and the compensating operation for the pixel PX are not performed, and the data signal supplied to the previous frame section (e.g., the first frame section FRAME1) may be maintained in the pixel PX (or the gate electrode of the first transistor T1).

As described with reference to FIG. 2, the first transistor T1 may include an oxide semiconductor, and the hysteresis (or hysteresis characteristics) of the oxide semiconductor may be much smaller than the hysteresis of the polysilicon semiconductor (e.g., about 1/100). Therefore, the data signal can be kept more constant.

At the tenth time t10, according to the third gate signal EM[N] of the turn-on voltage level, the current Id corresponding to the data signal may be supplied to the light emitting element LD. The light emitting element LD may emit light at a luminance corresponding to the current Id.

At the finish time of a second frame section FRAME2 (or start time of a third frame section FRAME3), the third gate signal EM[N] may be turned off. Thus, in the fourth section P4 of the second frame section FRAME2, the pixel PX may emit light at a luminance corresponding to the data signal. In other words, a period when the pixel PX emits light within the second frame section FRAME2 may be substantially equal to a period when the pixel PX emits light within the first frame section FRAME1.

For reference, in the second frame section FRAME2, when the third gate signal EM[N] has the same waveform as the waveform in the first frame section FRAME1, the pixel PX may further emit light for a time corresponding to the second section P2 of the first frame section FRAME1 (see FIG. 4). In other words, the period when the pixel PX emits light within the second frame section FRAME2 may be longer than the period when the pixel PX emits light within the first frame section FRAME1, and the luminance in the second frame section FRAME2 may be higher than the luminance in the first frame section FRAME1, which can be seen by a user as flicker.

Therefore, in the second frame section FRAME2, the third gate signal EM[N] may have a waveform different from that of the first frame section FRAME1, so that the period when the pixel PX emits light within the second frame section FRAME2 may be equal to the period when the pixel PX emits light within the first frame section FRAME1. In other words, the fifth transistor T5 is turned off for a longer period in the second frame section FRAME2 as compared to the first frame section FRAME1.

Figure 7A:
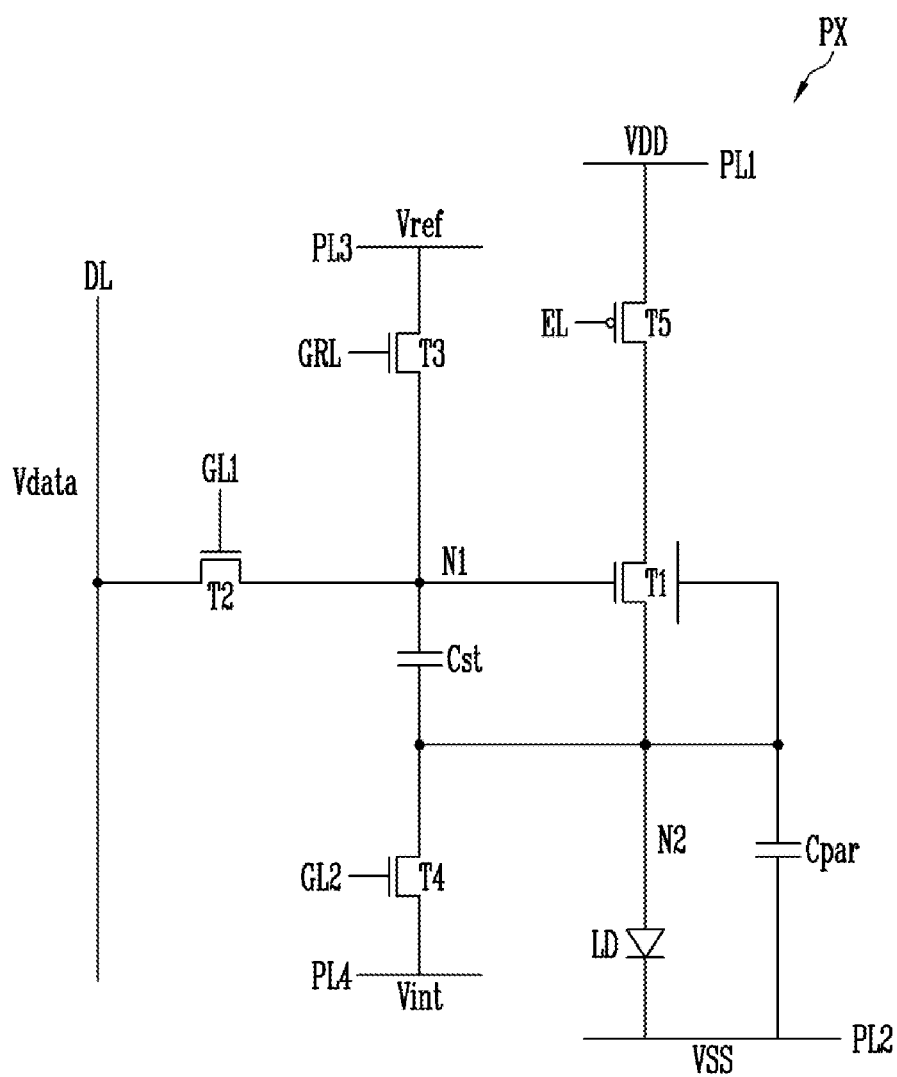
FIGS. 7A to 7C are circuit diagrams illustrating a pixel included in the display device of FIG. 1 according to an exemplary embodiment of the inventive concept.
Figure 7B:
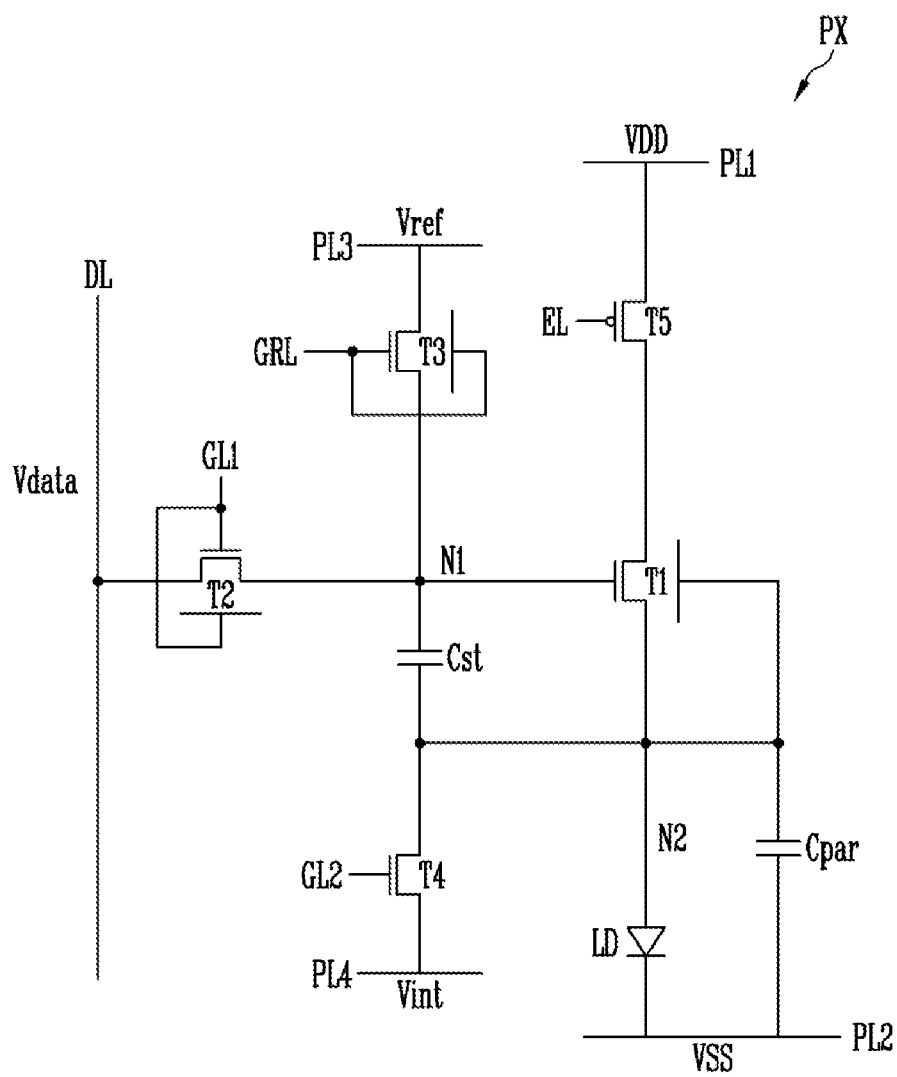
Figure 7C:
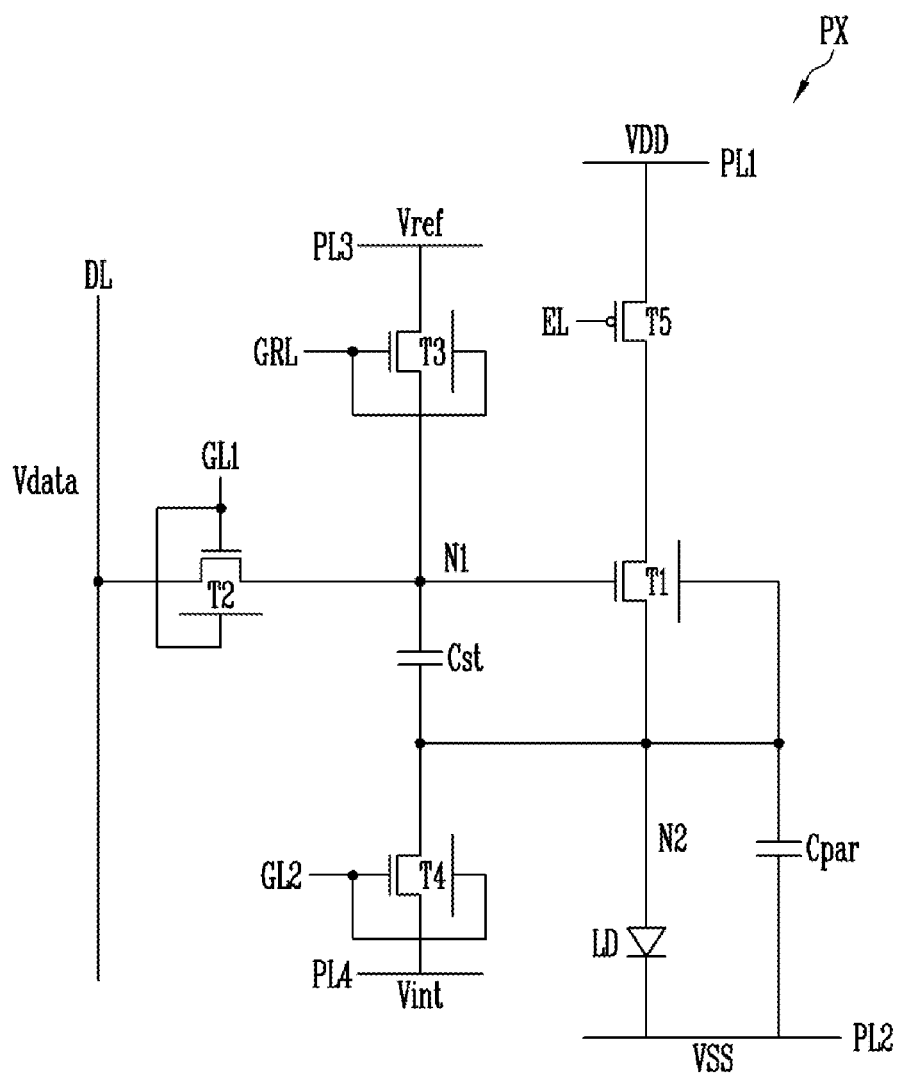

FIGS. 7A to C are circuit diagrams illustrating a pixel included in the display device of FIG. 1 according to an exemplary embodiment of the inventive concept. The pixel PX illustrated in FIGS. 7A to C may include one back-gate transistor, or three or more back-gate transistors.

Referring to FIGS. 2 and 7A, the pixel PX of FIG. 7A may be substantially equal to the pixel PX of FIG. 2 except for the second transistor T2. Thus, a duplicated description will not be repeated herein.

The second transistor T2 may include a first electrode coupled to the data line DL, a second electrode coupled to the first node N1, and a gate electrode coupled to the first scan line GL1. In other words, the second transistor T2 may not be implemented as a back-gate transistor but may be implemented as a single-gate transistor.

Referring to FIGS. 2 and 7B, the pixel PX of FIG. 7B may be substantially equal to the pixel PX of FIG. 2 except for the third transistor T3. Thus, a duplicated description will not be repeated herein.

The third transistor T3 may include a first electrode coupled to the third power line PL3, a second electrode coupled to the first node N1, a gate electrode coupled to the reference scan line GRL, and a back-gate electrode coupled to the reference scan line GRL (or gate electrode). In other words, the third transistor T3 may be implemented as a back-gate transistor.

Referring to FIGS. 7B and 7C, the pixel PX of FIG. 7C may be substantially equal to the pixel PX of FIG. 7B except for the fourth transistor T4. Thus, a duplicated description will not be repeated herein.

The fourth transistor T4 (or initialization transistor) may include a first electrode coupled to the second node N2, a second electrode coupled to the fourth power line PL4, a gate electrode coupled to the second scan line GL2, and a back-gate electrode coupled to the second scan line GL2 (or gate electrode). In other words, the fourth transistor T4 may be implemented as a back-gate transistor.

The pixel circuit and the display device in accordance with exemplary embodiments of the inventive concept independently perform the writing of the data signal and the compensation of the threshold voltage on the basis of different gate signals. Thus, the compensation time of the threshold voltage can be freely adjusted regardless of the resolution or high-frequency driving of the display device, and the compensation time of the threshold voltage can be more sufficiently secured.

While the inventive concept has been shown and described with reference to exemplary embodiments thereof, it should be understood by those of ordinary skill in the art that various changes, substitutions, and alternations in form and details may be made thereto without departing from the spirit and scope of the inventive concept as set forth by the appended claims.

What is claimed is:

1. A pixel circuit comprising:
   a first transistor including a first electrode, a second electrode coupled to a second node, a gate electrode coupled to a first node, and a bottom electrode directly coupled to the second node;
   a second transistor including a first electrode coupled to a data line, a second electrode coupled to the first node, and a gate electrode coupled to a first scan line;
   a third transistor including a first electrode coupled to a third power line, a second electrode coupled to the first node, and a gate electrode coupled to a reference scan line;
   a fourth transistor including a first electrode coupled to the second node, a second electrode coupled to a fourth power line, and a gate electrode coupled to a second scan line;
   a fifth transistor including a first electrode coupled to a first power line, a second electrode coupled to the first electrode of the first transistor, and a gate electrode coupled to a light-emitting control line; and
   a light emitting element coupled to the second node and a second power line.

2. The pixel circuit according to claim 1, wherein the bottom electrode of the first transistor is disposed to overlap the gate electrode of the first transistor with an insulating layer interposed therebetween.

3. The pixel circuit according to claim 2, wherein each of the first to fourth transistors comprises an oxide semiconductor, and
   the fifth transistor comprises a silicon semiconductor.

4. The pixel circuit according to claim 3, wherein the gate electrode of each of the first to fifth transistors is disposed on a semiconductor.

5. The pixel circuit according to claim 4, wherein the bottom electrode of the first transistor and the gate electrode of the fifth transistor are disposed on the same layer.

6. The pixel circuit according to claim 2, wherein the second transistor further comprises a bottom electrode coupled to the gate electrode of the second transistor.

7. The pixel circuit according to claim 6, wherein the third transistor further comprises a bottom electrode coupled to the gate electrode of the third transistor.

8. The pixel circuit according to claim 7, wherein the fourth transistor further comprises a bottom electrode coupled to the gate electrode of the fourth transistor.

9. The pixel circuit according to claim 1, further comprising:
   a capacitor coupled between the second node and the first node.

10. A display device comprising:
    a display including a first power line, a second power line, a third power line, a fourth power line, a data line, a first scan line, a second scan line, a reference scan line, a light-emitting control line, and a pixel;
    a data driver configured to supply a data signal to the data line; and
    a gate driver configured to sequentially supply a first gate signal to the second scan line and the first scan line, to supply a second gate signal to the reference scan line, and to supply a third gate signal to the light-emitting control line,
    wherein the pixel comprises:
      a first transistor including a first electrode, a second electrode coupled to a second node, a gate electrode coupled to a first node, a bottom electrode directly coupled to the second node;
      a second transistor including a first electrode coupled to the data line, a second electrode coupled to the first node, and a gate electrode coupled to the first scan line;
      a third transistor including a first electrode coupled to the third power line, a second electrode coupled to the first node, and a gate electrode coupled to the reference scan line;
      a fourth transistor including a first electrode coupled to the second node, a second electrode coupled to the fourth power line, and a gate electrode coupled to the second scan line;
      a fifth transistor including a first electrode coupled to the first power line, a second electrode coupled to the first electrode of the first transistor, and a gate electrode coupled to the light-emitting control line; and
      a light emitting element coupled to the second node and the second power line.

11. The display device according to claim 10, wherein the second transistor further comprises a bottom electrode coupled to the gate electrode of the second transistor.

12. The display device according to claim 11, wherein the third transistor further comprises a bottom electrode coupled to the gate electrode of the third transistor.

13. The display device according to claim 12, wherein the fourth transistor further comprises a bottom electrode coupled to the gate electrode of the fourth transistor.

14. The display device according to claim 10, further comprising:
    a capacitor coupled between the second node and the first node.

15. The display device according to claim 14, wherein, in a first section, the gate driver supplies the second gate signal having a turn-on voltage level to the reference scan line, and supplies the first gate signal having a turn-on voltage level to the second scan line.

16. The display device according to claim 15, wherein, in a second section, the gate driver supplies the third gate signal having a turn-on voltage level to the light-emitting control line, and supplies the first gate signal having a turn-off voltage level to the second scan line, and
    wherein the second section is different from the first section and is longer than the first section.

17. The display device according to claim 16, wherein, in a third section, the gate driver supplies the first gate signal having the turn-on voltage level to the first scan line, and
    wherein the third section is different from the first and second sections and has the same width as that of the first section.

18. The display device according to claim 17, wherein, in a fourth section, the gate driver supplies the third gate signal having the turn-on voltage level to the light-emitting control line, and the light emitting element emits light at a luminance corresponding to the data signal.

19. The display device according to claim 18, wherein the first to fourth sections are included in a first frame, wherein the second to fourth transistors maintain a turn-off state in a second frame subsequent to the first frame, and wherein a first period when the fifth transistor is turned off in the second frame is longer than a second period when the fifth transistor is turned off in the first frame.

20. The display device according to claim 19, wherein a period when the light emitting element emits light in the second frame is substantially the same as a period when the light emitting element emits light in the first frame.

* * * * *